United States Patent
Benson

(10) Patent No.: US 7,583,358 B2
(45) Date of Patent: Sep. 1, 2009

(54) SYSTEMS AND METHODS FOR RETRIEVING RESIDUAL LIQUID DURING IMMERSION LENS PHOTOLITHOGRAPHY

(75) Inventor: Peter A. Benson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 821 days.

(21) Appl. No.: 11/189,236

(22) Filed: Jul. 25, 2005

(65) Prior Publication Data

US 2007/0019172 A1   Jan. 25, 2007

(51) Int. Cl.
G03B 27/42 (2006.01)
G03B 27/52 (2006.01)
G03B 27/58 (2006.01)
G03B 27/32 (2006.01)

(52) U.S. Cl. .............................. 355/53; 355/30; 355/72; 355/77

(58) Field of Classification Search .................... 355/30, 355/53, 75, 77, 72
See application file for complete search history.

(56) References Cited

U.S. PATENT DOCUMENTS

| | | | |
|---|---|---|---|
| 4,346,164 | A | 8/1982 | Tabarelli et al. |
| 4,968,375 | A | 11/1990 | Sato et al. |
| 5,260,174 | A | 11/1993 | Nakazawa et al. |
| 5,452,053 | A | 9/1995 | Nozue et al. |
| 5,559,582 | A | 9/1996 | Nishi et al. |
| 5,673,208 | A | 9/1997 | Meier et al. |
| 5,698,069 | A | 12/1997 | Aiyer et al. |
| 5,825,470 | A | 10/1998 | Miyai et al. |
| 5,871,584 | A | 2/1999 | Tateyama et al. |
| 5,931,722 | A | 8/1999 | Ohmi et al. |
| 6,038,015 | A | 3/2000 | Kawata |
| 6,266,132 | B1 | 7/2001 | Stewart et al. |

(Continued)

FOREIGN PATENT DOCUMENTS

EP    0605103 A1    7/1994

(Continued)

OTHER PUBLICATIONS

International Search Report and Written Opinion of the International Search Authority for International Application No. PCT/US2006/027370, 18 pages, May 22, 2007.

(Continued)

*Primary Examiner*—Alan A Mathews
(74) *Attorney, Agent, or Firm*—Perkins Coie LLP

(57) ABSTRACT

Systems and methods for retrieving residual liquid during immersion lens photolithography are disclosed. A method in accordance with one embodiment includes directing radiation along a radiation path, through a lens and through a liquid volume in contact with the lens, to a microfeature workpiece in contact with the liquid volume. The method can further include, while moving at least one of the microfeature workpiece and the lens relative to the other, recovering liquid from the liquid volume and replenishing liquid in the liquid volume. A spacing between the lens and the microfeature workpiece can be controlled by providing a gas bearing between the lens and the microfeature workpiece. Residual liquid remaining on a surface on the microfeature workpiece can be directed back into the liquid volume, for example, by injecting a gas through at least one injection port that is oriented annularly inwardly toward the liquid volume.

64 Claims, 4 Drawing Sheets

U.S. PATENT DOCUMENTS

| | | | |
|---|---|---|---|
| 6,269,517 B1 | 8/2001 | Dornier et al. |
| 6,290,863 B1 | 9/2001 | Morgan et al. |
| 6,459,473 B1 | 10/2002 | Chang et al. |
| 6,466,315 B1 | 10/2002 | Karpol et al. |
| 6,496,257 B1 | 12/2002 | Taniguchi et al. |
| 6,529,274 B1 | 3/2003 | Hickman |
| 6,550,990 B2 | 4/2003 | Sakurai et al. |
| 6,563,568 B2 | 5/2003 | Pierrat |
| 6,624,879 B2 | 9/2003 | Imai et al. |
| 6,666,927 B2 | 12/2003 | Gindel |
| 6,682,406 B2 | 1/2004 | Chiou et al. |
| 6,809,794 B1 | 10/2004 | Sewell |
| 6,817,057 B2 | 11/2004 | Shirley et al. |
| 6,862,080 B2 | 3/2005 | Matsui et al. |
| 6,867,844 B2 | 3/2005 | Vogel et al. |
| 6,970,228 B1 | 11/2005 | Aoki et al. |
| 2003/0200996 A1 | 10/2003 | Hiatt et al. |
| 2004/0118184 A1 | 6/2004 | Violette |
| 2004/0154530 A1 | 8/2004 | Hiatt et al. |
| 2004/0169924 A1 | 9/2004 | Flagello et al. |
| 2004/0207824 A1 | 10/2004 | Lof et al. |
| 2004/0211920 A1 | 10/2004 | Derksen et al. |
| 2004/0263808 A1 | 12/2004 | Sewell |
| 2005/0018155 A1* | 1/2005 | Cox et al. ............... 355/30 |
| 2005/0024609 A1 | 2/2005 | De Smit et al. |
| 2005/0028314 A1 | 2/2005 | Hickman et al. |
| 2005/0042554 A1 | 2/2005 | Dierichs et al. |
| 2005/0048220 A1 | 3/2005 | Mertens et al. |
| 2005/0078287 A1 | 4/2005 | Sengers et al. |
| 2005/0259234 A1* | 11/2005 | Hirukawa et al. ............. 355/53 |
| 2005/0264802 A1 | 12/2005 | Shibata et al. |
| 2006/0023185 A1 | 2/2006 | Hazelton et al. |
| 2006/0250588 A1 | 11/2006 | Brandl |
| 2007/0242242 A1 | 10/2007 | Nagasaka et al. |
| 2007/0268470 A1 | 11/2007 | Shibazaki |
| 2008/0094590 A1 | 4/2008 | Coon |

FOREIGN PATENT DOCUMENTS

| | | | |
|---|---|---|---|
| EP | 1 489 462 A2 | 12/2004 |
| EP | 1 498 778 A1 | 1/2005 |
| EP | 1612850 A1 | 1/2006 |
| EP | 1 681 597 A2 | 7/2006 |
| EP | 1 739 492 A2 | 1/2007 |
| JP | 1-171762 | 7/1989 |
| JP | 1-283930 | 11/1989 |
| JP | 5-291400 | 11/1993 |
| JP | 7-302827 | 11/1995 |
| JP | 10-223740 | 8/1998 |
| JP | 10-294261 | 11/1998 |
| JP | 2000-150627 | 5/2000 |
| KR | 2003056808 | 7/2003 |
| WO | WO-2004/090577 A2 | 10/2004 |

OTHER PUBLICATIONS

U.S. Appl. No. 11/214,388, filed Aug. 29, 2005, Parekh.
U.S. Appl. No. 11/335,251, filed Jan. 18, 2006, Manning.
U.S. Appl. No. 11/432,153, filed May 10, 2006, Hickman.
U.S. Appl. No. 11/432,160, filed May 10, 2006, Hickman.
Chang, K., "When There Is Splish, but No Splash," 1 page, New York Times, Apr. 5, 2005.

* cited by examiner

SYSTEMS AND METHODS FOR RETRIEVING RESIDUAL LIQUID DURING IMMERSION LENS PHOTOLITHOGRAPHY

TECHNICAL FIELD

The present invention is directed generally to methods and systems for retrieving residual liquid during immersion lens photolithography.

BACKGROUND

Photolithography is a common technique used for manufacturing microelectronic circuits and other microfeature devices. In a typical photolithographic process, a microfeature workpiece (e.g., a silicon wafer) is coated with a photosensitive material. Selected portions of the photosensitive material are then exposed to a radiation beam, while neighboring portions are protected from exposure to the radiation by a mask. As a result of being exposed to the radiation, the selected portions can become resistant to a photoresist etchant, or susceptible to the photoresist etchant. Accordingly, when the workpiece is exposed to the photoresist etchant, the photosensitive material is removed from either the exposed regions or the protected regions. The photosensitive material remaining on the workpiece can protect the workpiece material underneath during a subsequent process, such as an etching process for removing material from the workpiece. Using this technique, material can be selectively removed from some portions of the workpiece but not others, allowing the formation of structures (e.g., circuit elements and conductive lines and/or vias) in the workpiece.

FIG. 1 is a partially schematic illustration of a photolithographic system 10 configured in accordance with the prior art. The system 10 includes a workpiece support 11 that carries a microfeature workpiece 12 beneath a lens system 20. An upper surface 13 of the workpiece 12 is selectively exposed to radiation passing along a radiation path 42 through a series of lenses, including a terminal lens 21. The region between the terminal lens 21 and the workpiece surface 13 is filled with a liquid volume 22, forming an immersion lens system. The liquid in the liquid volume 22 can include water or another liquid having a relatively high index of refraction. Accordingly, the photolithographic system 10 can image smaller features on the workpiece 12 than would be the case if the region between the lens 21 and the workpiece surface 13 were filled with air.

In operation, the workpiece support 11 scans or steps the workpiece 12 relative to the lens 21 by moving sequentially along transverse axes A and B. As the workpiece support 11 moves, liquid is continuously supplied to the liquid volume 22 through one or more supply ports 23 and removed from the liquid volume 22 through one or more return ports 24. The roles of the supply ports 23 and the return ports 24 can be reversed when the motion of the workpiece support 11 reverses. In this manner, the liquid volume 22 can remain in a generally fixed location relative to the terminal lens 21 as the workpiece 12 moves relative to the terminal lens 21.

The terminal lens 21 can be supported at a selected distance away from the upper surface 13 of the workpiece 12 by an air bearing 30. Accordingly, the air bearing 30 can include a plurality of air bearing nozzles 31 through which air is injected downwardly toward the upper surface 13, forming an air cushion 32 between the lens system 20 and the workpiece upper surface 13. Vacuum ports 25 are positioned around the periphery of the liquid volume 22 to withdraw residual fluid that may remain on the workpiece upper surface 13 after it contacts the liquid volume 22. The vacuum ports 25 can also be used to secure a cover over the terminal lens 21 when the system 10 is not in use.

One drawback with the foregoing arrangement is that, despite the presence of the vacuum ports 25, residual liquid can remain on the workpiece upper surface 13 after the upper surface 13 passes beneath the liquid volume 22. Remaining water droplets can leave stains or other marks on the upper surface 13 after the droplets themselves evaporate. This has been the case even when highly purified water is used to form the liquid volume 22. These marks can interfere with downstream processes, reducing the efficiency and/or effectiveness of these processes and therefore the overall process of forming microelectronic features in the workpiece 12.

DETAILED DESCRIPTION

A. Introduction

Figure 1:
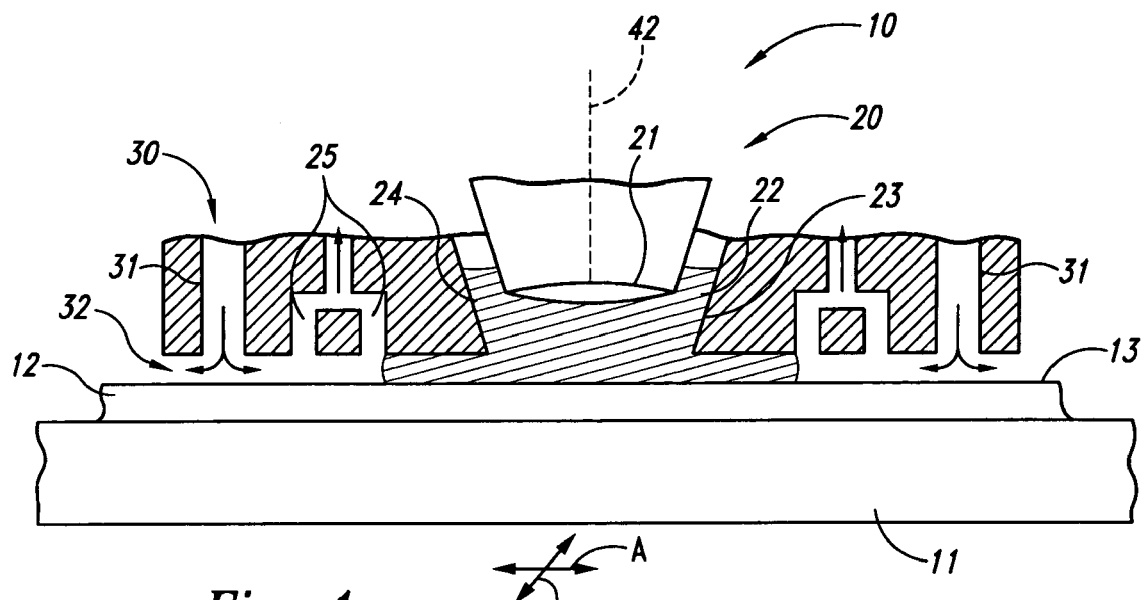
FIG. 1 is a partially schematic, side elevational view of a photolithography system configured in accordance with the prior art.

The following disclosure describes several embodiments of systems and methods for retrieving residual liquid during immersion lens photolithography. One such device includes a support configured to carry a microfeature workpiece, a radiation system positioned proximate to the support to direct radiation along a radiation path toward the support, and an immersion lens system. The immersion lens system can in turn include a lens and a liquid supply device having at least one liquid supply port positioned to deliver a liquid proximate to the lens. The lens and/or the support can be movable relative to each other, e.g., to serially expose portions of the workpiece to the radiation. The liquid supply device can further include a liquid return port positioned proximate to the liquid supply port to remove liquid. The system can further include a gas bearing having at least one nozzle directed toward the support, and a gas injection device having at least one inwardly directed injection port.

In further particular embodiments, the gas injection device can include an inwardly directed injection port positioned inwardly from the gas bearing and outwardly from the liquid supply port. The gas injection device can further include a recovery port positioned inwardly from the injection port. For example, the injection port can be oriented at an angle less than 90° relative to the surface plane of a microfeature workpiece carried by the support. In still another particular aspect of this embodiment, the gas injected through the gas injection device can include nitrogen.

Further aspects of the invention are directed toward methods for irradiating a microfeature workpiece. One such method can include directing radiation along a radiation path, through a lens and through a liquid volume in contact with the lens to a microfeature workpiece that is also in contact with the liquid volume. The method can further include recovering liquid from the liquid volume and replenishing liquid in the liquid volume while moving at least one of the microfeature workpiece and the lens relative to the other. A spacing between the lens and the microfeature workpiece can be controlled by providing a gas bearing between the lens and the microfeature workpiece. The method can still further include directing residual liquid remaining on a surface of the microfeature workpiece back into the liquid volume.

In further particular aspects, directing residual liquid can include directing residual liquid annularly inwardly toward the liquid volume by injecting a gas through at least one injection port that is oriented annularly inwardly toward the liquid volume. In still a further particular aspect, directing residual liquid remaining on a surface of the workpiece can include directing a first quantity of residual liquid remaining on a portion of the surface of the workpiece into the liquid volume. Liquid that was directed into the liquid volume can then be recovered (e.g., by recovering liquid from the liquid volume). The method can further include removing a second quantity of residual liquid remaining on the surface of the workpiece by applying a vacuum proximate to the surface of the workpiece.

As used herein, the terms "microfeature workpiece" and "workpiece" refer to substrates in and/or on which microelectronic devices are integrally formed. Typical micro-devices include microelectronic circuits or components, thin-film recording heads, data storage elements, microfluidic devices and other products. Micro machines and micromechanical devices are included within this definition because they are manufactured using much of the same technology that is used in the fabrication of integrated circuits. Substrates can be semiconductive pieces.(e.g., doped silicon wafers or gallium arsenide wafers), non-conductive pieces (e.g., various ceramic substrates), or conductive pieces. In some cases the workpieces are generally round, and in other cases the workpieces have other shapes, including rectilinear shapes. Several embodiments of systems and methods for carrying out photolithographic processes on workpieces are described below. A person skilled in the relevant art will understand, however, that the invention may have additional embodiments, and that the invention may be practiced without several of the details of the embodiments described below with reference to FIGS. 2-6.

B. Systems and Methods for Retrieving Residual Liquid

Figure 2:
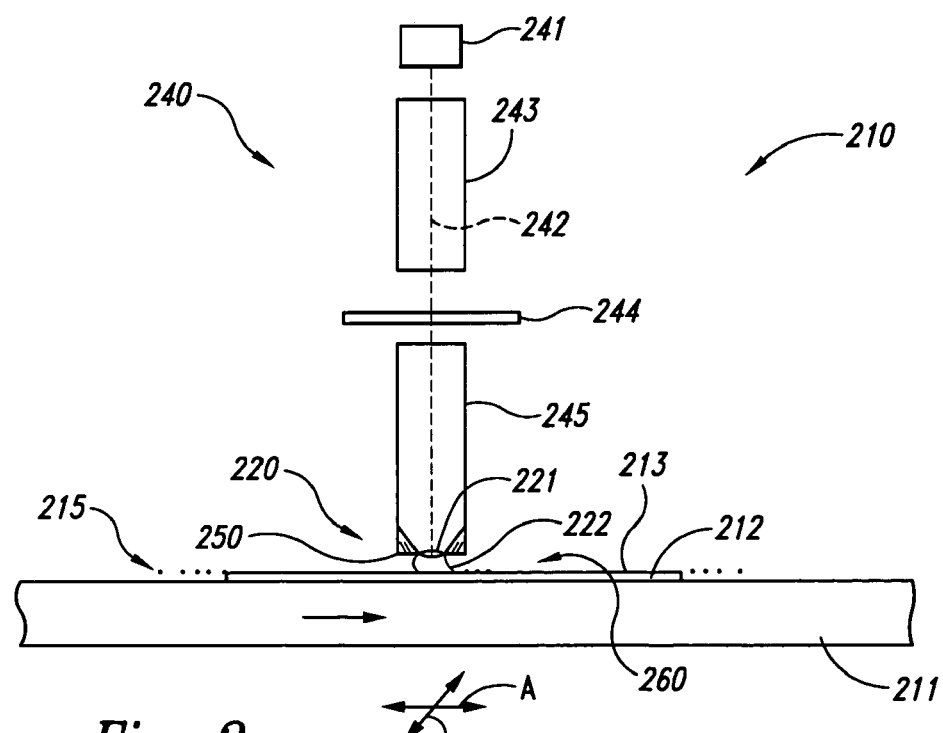
FIG. 2 is a partially schematic, side elevational view of a photolithography system having a gas injection device configured in accordance with an embodiment of the present invention.

FIG. 2 is a schematic illustration of a photolithography system 210 configured in accordance with an embodiment of the invention. The system 210 can include a support 211 that carries a microfeature workpiece 212 for exposure to a selected radiation. The radiation can have a wavelength suitable for photolithography applications, for example, 157 nm, 193 nm, 248 nm, or 365 nm. An upper surface 213 of the microfeature workpiece 212 can be positioned at a surface location 215 (e.g., a surface plane). A radiation system 240 and a lens system 220 provide, control, and direct the radiation so as to focus the radiation at the surface location 215. Accordingly, the radiation system 240 can include a radiation source 241 that directs radiation along a radiation path 242 to and through a mask 244 via first optics 243. The radiation proceeds along the radiation path 242 via second optics 245 through the lens system 220 to the microfeature workpiece 212.

The lens system 220 can include a liquid immersion lens having a terminal lens 221 positioned above the microfeature workpiece 212, and a liquid volume 222 positioned between and in contact with the microfeature workpiece 212 and the terminal lens 221. The support 211 scans or steps along the orthogonal axes A and B, as discussed above, to expose the microfeature workpiece 212 to the radiation. As the microfeature workpiece 212 moves relative to the liquid volume 222, residual liquid 260 may be left behind on the surface of the microfeature workpiece 212. Accordingly, the system 210 can include a gas injection device 250 that redirects at least some of the residual liquid 260 before it evaporates from the surface of the microfeature workpiece 212. As a result, the gas injection device 250 can reduce or eliminate the tendency for the residual liquid 260 to leave potentially damaging watermarks (e.g., spots), which might otherwise result if the residual liquid 260 is left to evaporate from the microfeature workpiece 212.

Figure 3:
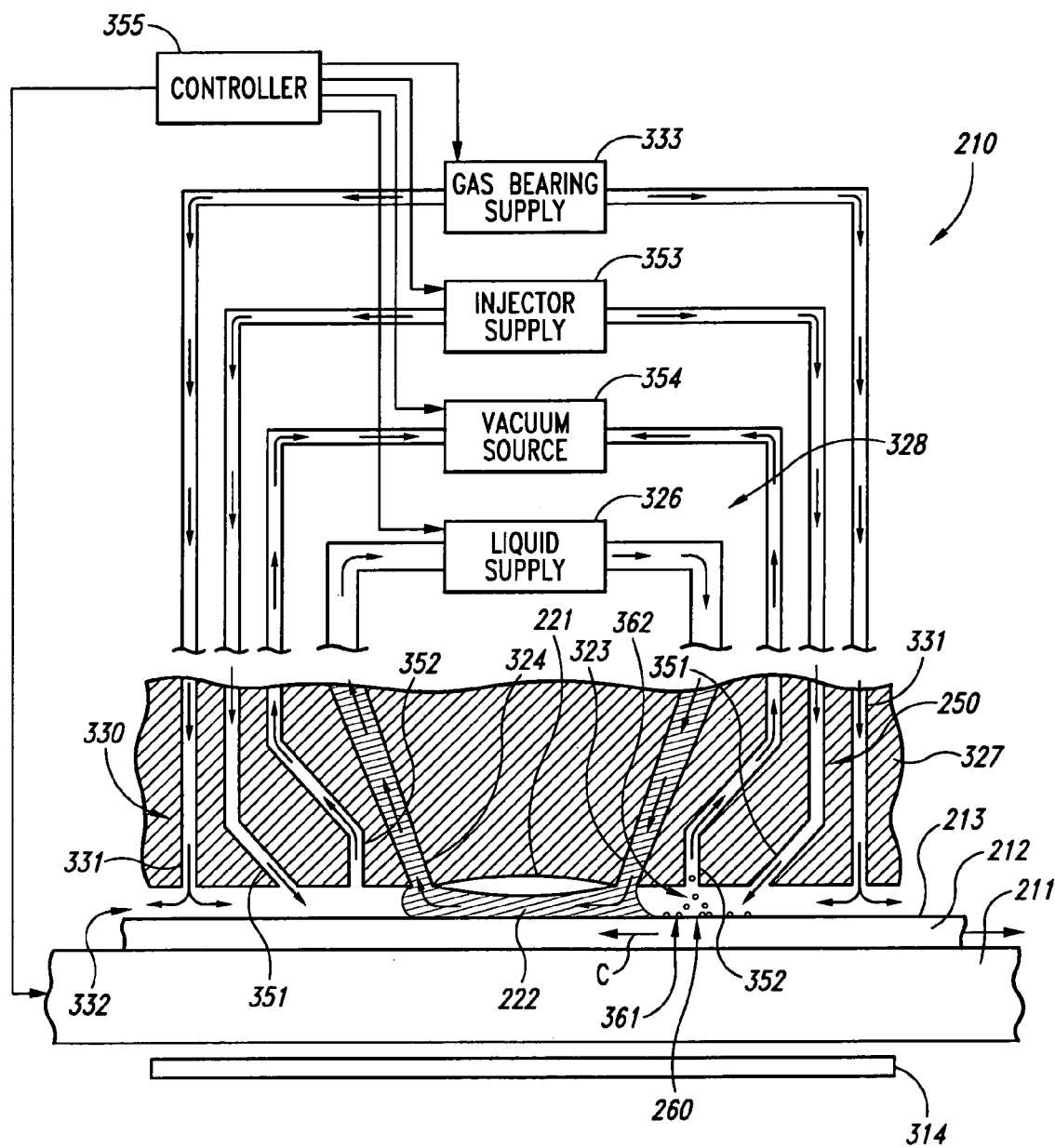
FIG. 3 is an enlarged, partially schematic, side elevational view of an embodiment of the gas injection device shown in FIG. 2.

FIG. 3 is an enlarged, partially schematic illustration of a portion of the photolithographic system 210 and the microfeature workpiece 212 shown in FIG. 2. The system 210 can include a liquid supply device 328 that provides a liquid (e.g., highly purified water) to the liquid volume 222 via a liquid reservoir 326 and a liquid supply port 323. The liquid can be returned to the liquid reservoir 326 via a liquid return port 324, or the liquid can be removed entirely from the system via the liquid return port 324. In either embodiment, the liquid supply device 328 can be configured to supply and remove liquid from the liquid volume 222 as the microfeature workpiece 212 moves beneath the terminal lens 221. As the microfeature workpiece 212 moves, a gas bearing 330 can maintain the proper spacing between the terminal lens 221 and the upper surface 213 of the microfeature workpiece 212. Accordingly, the gas bearing 330 can direct gas from a gas-bearing supply 333 toward the microfeature workpiece 212 through multiple gas bearing nozzles 331 to form a gas cushion 332 between the microfeature workpiece 212 and a housing 327 that supports the terminal lens 221. The gas cushion 332 can include air or another suitable gas. The workpiece support 211 may also move in a direction normal to the surface 213 of the microfeature workpiece 212 to control the workpiece/lens spacing.

In a particular aspect of an embodiment shown in FIG. 3, features of the gas injection device 250 can be positioned between the gas bearing 330 and the liquid supply and return ports 323, 324. These features can include one or more injection ports 351 and one or more recovery ports 352 positioned proximate to the injection ports 351. The flow path of gas provided to the gas bearing nozzles 331 can be independent of the flow path of gas provided to the injection ports 351 so that these two systems can be independently controlled. Accordingly, these two flow paths can be out of fluid communication with each other, at least upstream of the gas bearing nozzles 331 and the injection ports 351. The injection ports 351 can be arranged annularly around the liquid volume 222, and can be inclined so as to direct gas annularly inwardly toward the liquid volume 222. In a particular embodiment, the injection ports 351 can be oriented at an angle of about 45° relative to the surface 213 of the microfeature workpiece 212. In other embodiments, the injection ports 351 can be oriented at other angles (less than 90°) relative to the surface 213 of the microfeature workpiece 212.

The injection ports 351 can be coupled to an injector supply 353, e.g., a supply of pressurized gas. In one embodiment, the pressurized gas can include nitrogen and in other embodiments the pressurized gas can include other suitable gases. The recovery ports 352 can be coupled to a vacuum source 354. When the injector gas is provided through the injection ports 351, it can impinge on the residual liquid 260 and drive the residual liquid toward the liquid volume 222. At least some of the residual liquid 260 (e.g., a first portion 361) can be driven along the surface of the microfeature workpiece 212 as indicated by arrow C until it merges with the liquid volume 222. In some embodiments the entire amount of the residual liquid 260 is directed in this manner. In other embodiments, another portion of the residual liquid 260 (e.g., a second portion 362) can be removed from the surface of the microfeature workpiece 212 through the recovery port 352. In any of these embodiments, the residual liquid 260 can be removed from the surface of the microfeature workpiece 212. Accordingly, the likelihood for leaving watermarks or other potentially interfering features on the surface of the microfeature workpiece 212 can be reduced or eliminated.

In one aspect of an embodiment shown in FIG. 3, the recovery ports 352 can provide functions in addition to removing the residual liquid 260. For example, when the photolithography system 210 is not in active use with a microfeature workpiece 212, a cover 314 can be placed against the housing 327, and the recovery ports 352 can provide a pressure differential sufficient to keep the cover 314 in place.

A controller 355 can be operatively coupled to the support 211, the gas injection device 250, the lens system 220 and the gas bearing 330 to control the activation and operation of these systems. Further details of such operations are described later with reference to FIGS. 4-6.

One feature of an embodiment of the photolithography system 210 described above with reference to FIGS. 2 and 3 is that it can include a gas injection device 250 that is positioned to direct the residual liquid 260 in such a manner that it does not remain on the surface of the microfeature workpiece 212. As discussed above, some or all of the residual liquid 260 can be directed into the liquid volume 222 where the liquid is removed from the microfeature workpiece 212 via the liquid return port 324. At the same time, the relative spacing between the terminal lens 221 and the microfeature workpiece 212 can be maintained by the gas bearing 330. The effect of this arrangement is to dry the microfeature workpiece 212 without relying on evaporation to do so. An advantage of the foregoing features is that they can reduce the likelihood for leaving potentially damaging marks on the microfeature workpiece 212, while at the same time maintaining the proper spacing between the microfeature workpiece 212 and the terminal lens 221. As a result, the overall efficiency of the photolithography system 210 can be improved because the throughput of microfeature workpieces 212 that do not have the potentially deleterious effects of residual liquid 260 can be increased.

Figure 4:
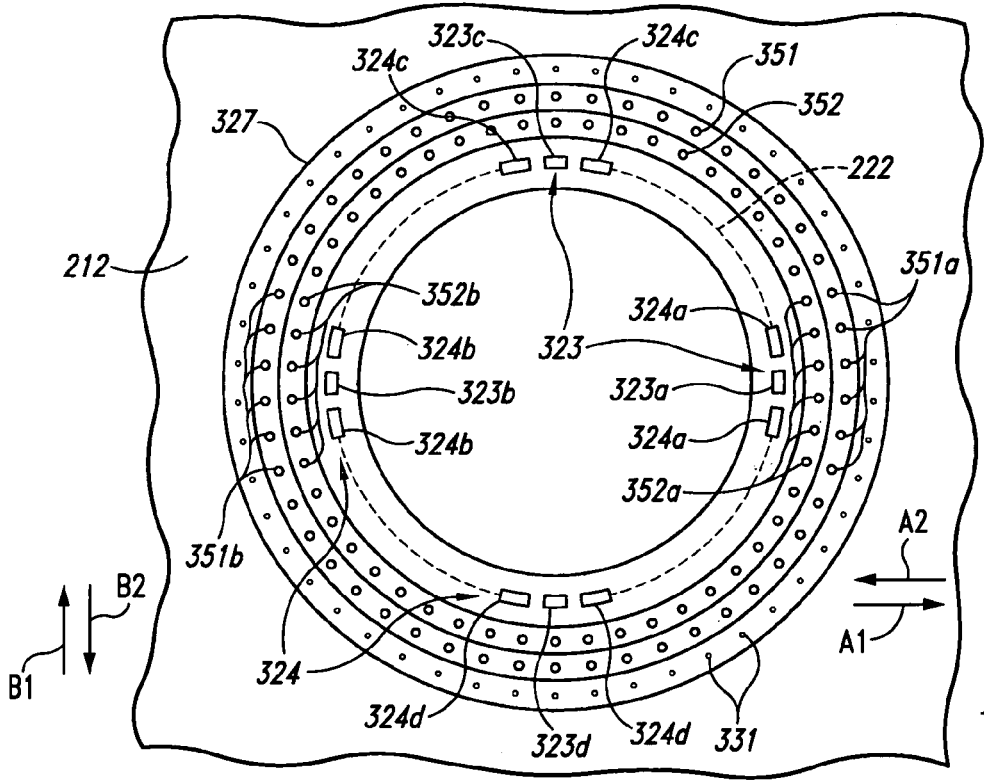
FIG. 4 is a plan view of a portion of the photolithography system shown in FIGS. 2 and 3 having injection and recovery ports configured in accordance with an embodiment of the invention.
Figure 5:
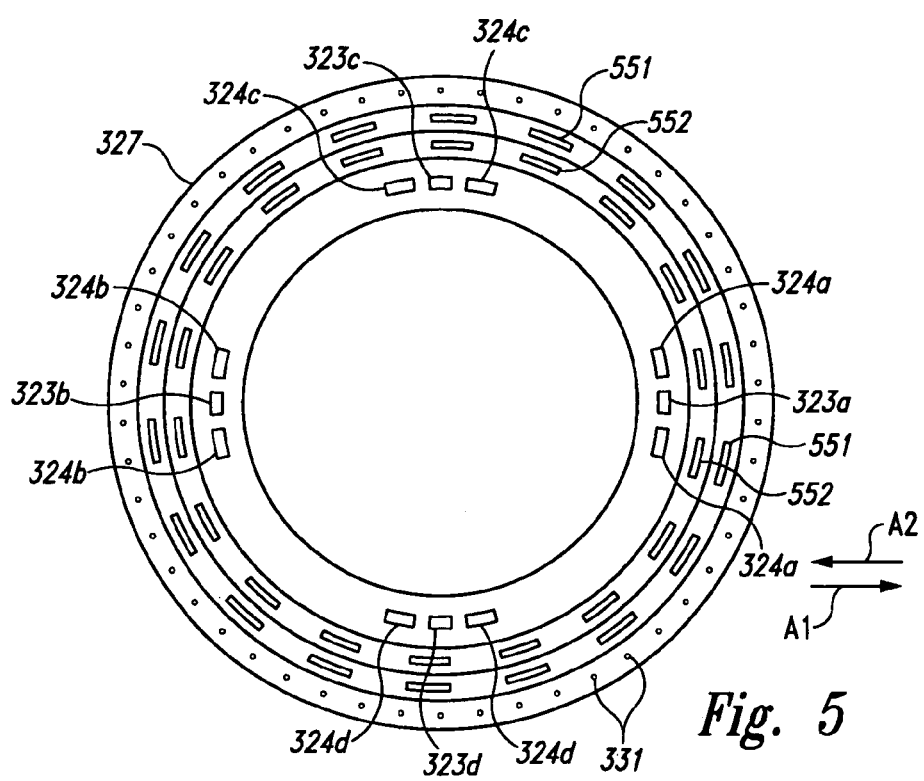
FIG. 5 is a plan view of a portion of the photolithography system shown in FIGS. 2 and 3 having injection ports and recovery ports configured in accordance with another embodiment of the invention.

FIGS. 4 and 5 are cross-sectional plan views of housings 327 having injection and recovery port configurations in accordance with further embodiments of the invention. Referring first to FIG. 4, the housing 327 can carry generally round injection ports 351 and generally round recovery ports 352. The injection ports 351 and recovery ports 352 can be arranged in a continuous manner around the liquid supply ports 323 and return ports 324. The liquid supply ports 323 and liquid return ports 324 can be selectively activated and deactivated in a manner that depends upon the relative motion of the microfeature workpiece 212. For example, when the microfeature workpiece 212 travels from left to right (as indicated by arrow A1), the liquid supply port 323a toward the right side of FIG. 4 can be active and the liquid return ports 324a can be inactive. The liquid supply port 323b toward the left side of FIG. 4 can be inactive while the liquid return ports 324b toward the left side of FIG. 4 can be active. When the direction of the microfeature workpiece 212 is reversed (as indicated by arrow A2), the active/inactive status of the liquid supply ports 323a, 323b and liquid return ports 324a, 324b can be reversed. A similar arrangement can be used to control liquid supply and recovery when the motion of the microfeature workpiece is in the transverse direction (as indicated by arrows B1 and B2) by activating and deactivating liquid supply ports 323c, 323d and liquid return ports 324c, 324d. Further details of arrangements for controlling such motion are disclosed in U.S. Pat. No. 6,867,844 and published U.S. Application US2005/0078287, both of which are incorporated herein by reference.

In one aspect of an embodiment shown in FIG. 4, the operation of the injection ports 351 and the recovery ports 352 can be generally similar to that described above with reference to the liquid supply ports 323 and return ports 324. Accordingly, selected injection ports 351 and recovery ports 352 can be activated or deactivated in a manner that is consistent with the motion of the workpiece 212. For example, in one embodiment, only the injection ports 351a and recovery ports 352a that are adjacent to the trailing edge of the liquid volume 222 are activated when the microfeature workpiece moves in direction A1. When the direction of the microfeature workpiece 212 changes to A2 (which changes the location of the trailing edge of the liquid volume 222), the initially active injection and recovery ports 351a, 352a can be deactivated, and the initially inactive injection and recovery ports 351b, 352b can be activated. A similar arrangement can be used to selectively activate injection and recovery ports in the transverse direction, when the microfeature workpiece moves as indicated by arrows B1 and B2.

In another embodiment, all the injection ports 351 and recovery ports 352 can remain active at all times during the exposure of the microfeature workpiece 212. Accordingly, such an arrangement need not require a procedure for selectively activating and deactivating the injection and recovery ports 351, 352. Such an arrangement may in some cases further increase the chances for the residual liquid to be exposed to injection ports 351 and recovery ports 352 multiple times as the microfeature workpiece 212 moves relative to the liquid volume 222. As a result, if some of the residual liquid was not recovered during one pass by the injection ports 351 and recovery ports 352, the remaining residual liquid may be recovered or directed into the liquid volume 222 during another pass. In either arrangement, activation of the injection ports 351 and recovery ports 352 can be controlled by the controller 355.

FIG. 5 illustrates a plan view of the housing 327 having injection ports 551 and recovery ports 552 shaped in accordance with another embodiment of the invention. In particular, both the injection ports 551 and the recovery ports 552 can have a slot shape or another non-circular shape. Such a shape may in some cases be more conducive to directing the residual liquid in the manner described above. In still further embodiments, the injection ports 551 and recovery ports 552 can have other shapes and/or arrangements. In at least some of these embodiments, the shape of the injection ports 551 can be different than the shape of the recovery ports 552.

Figure 6:
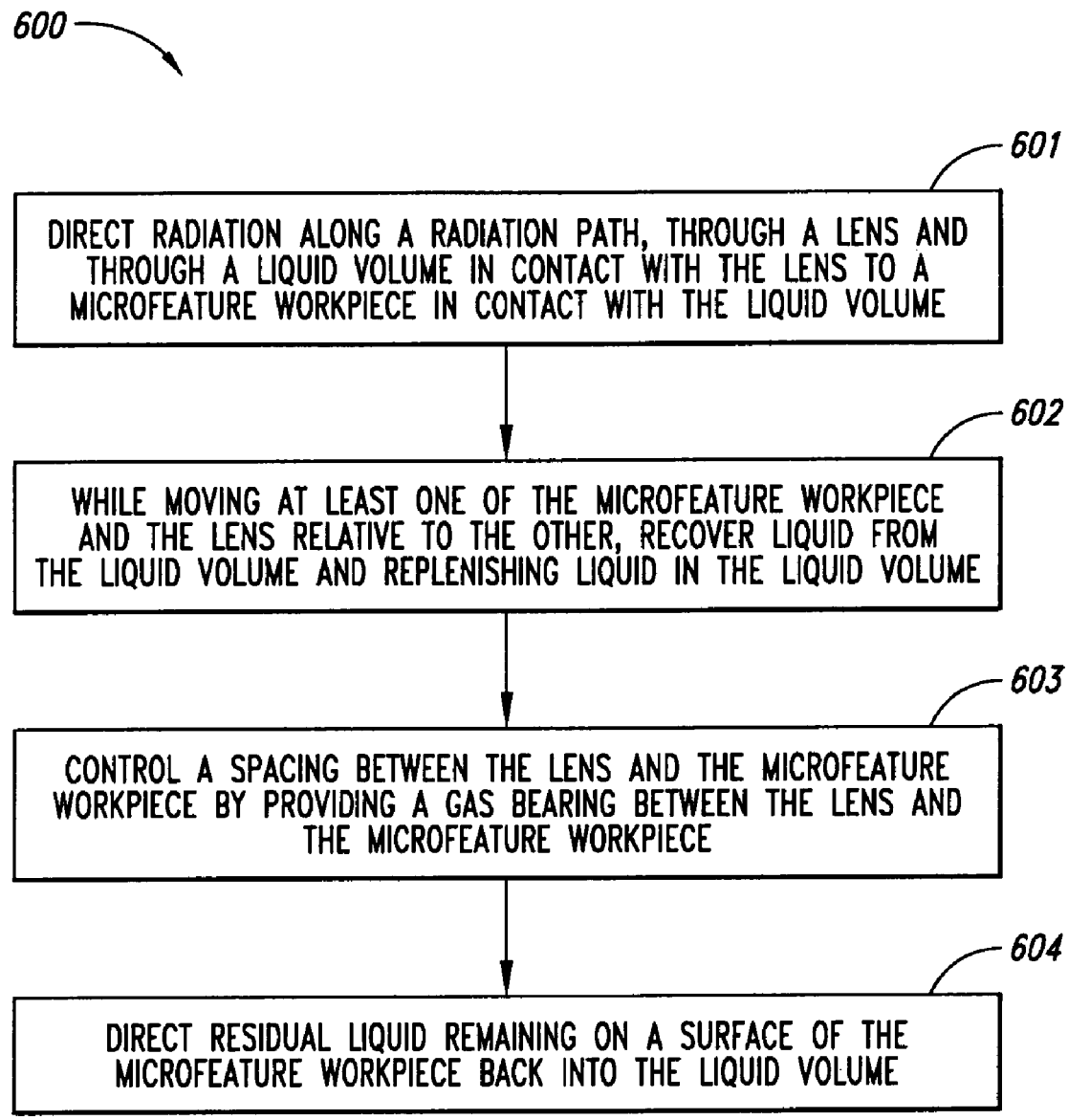
FIG. 6 is a flow diagram illustrating a method in accordance with an embodiment of the invention.

FIG. 6 is a flow diagram illustrating a process 600 for exposing a microfeature workpiece to radiation in accordance with several embodiments of the invention. In process portion 601, the process 600 can include directing radiation along a radiation path, through a lens, and through a liquid volume in contact with the lens to a microfeature workpiece that is also in contact with the liquid volume. In process portion 602, the process 600 can include (while moving at least one of the microfeature workpiece and the lens relative to the other), recovering liquid from the liquid volume and replenishing liquid in the liquid volume. In process portion 603, a spacing between the lens and the microfeature workpiece is controlled by providing a gas bearing between the lens and the microfeature workpiece. In process portion 604, residual liquid remaining on a surface of the microfeature workpiece is directed back into the liquid volume. As was described above, the process for directing residual liquid back in to the liquid volume can optionally be supplemented by removing liquid from the surface of the microfeature workpiece via recovery ports.

From the foregoing, it will be appreciated that specific embodiments of the invention have been described herein for purposes of illustration, but that various modifications may be made without deviating from the invention. For example, in some embodiments, a gas other than (or in addition to) nitrogen can be used to direct the motion of residual liquid on the microfeature workpiece. Suitable gases can include argon and in some cases, clean dry air. Generally, suitable gases are gases that are inert and have a low solubility in the residual liquid. Aspects of the invention described in the context of particular embodiments may be combined or eliminated in other embodiments. For example, gas injection ports having a shape generally similar to that shown in FIG. 5 can be combined with recovery ports generally similar to those shown in FIG. 4. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

I claim:

1. A photolithography system for microfeature workpieces, comprising:
    a movable support configured to carry a microfeature workpiece with a surface of the microfeature workpiece at a surface location;
    a radiation system positioned proximate to the support to direct radiation along a radiation path toward the support; and
    an immersion lens system that includes:
        a lens;
        a liquid supply device having at least one liquid supply port positioned to deliver a liquid to the surface location proximate to the lens while the support moves the microfeature workpiece relative to the lens, the liquid supply device further including a liquid return port positioned proximate to the at least one liquid supply port to remove liquid at least proximate to the surface location;
        a gas bearing positioned outwardly from the liquid supply port and the liquid return port, the gas bearing having multiple generally downwardly directed nozzles directed toward the surface location to maintain a relative separation between the surface location and the lens;
        a gas injection device having at least one inwardly directed injection port positioned inwardly from the gas bearing and outwardly from the at least one liquid supply port, the gas injection device further having a recovery port positioned inwardly from the injection port; and
        a controller having instructions to activate selected injection and recovery ports depending upon the relative motion between the lens and the support.

2. The system of claim 1 wherein a flow of gas along a flow path upstream of the nozzles of the gas bearing is separately controllable from a flow of gas along a flow path upstream of the at least one gas injection port.

3. The system of claim 1 wherein the injection port is directed inwardly and downwardly to the surface location, and is oriented at an angle less than 90° relative to a plane of the surface location.

4. The system of claim 1, further comprising the microfeature workpiece.

5. The system of claim 1, further comprising a removable lens cover, and wherein the recovery port includes one of a plurality of recovery ports that are coupleable to a vacuum source, and wherein the recovery ports are positioned to releasably secure the cover to the immersion lens system when the immersion lens system is not in use.

6. The system of claim 1 wherein the at least one injection port includes a plurality of injection ports arranged annularly around the at least one liquid supply port.

7. The system of claim 1 wherein the at least one injection port includes a slot.

8. The system of claim 1 wherein the gas injection device includes a gas source coupled to the at least one injection port.

9. The system of claim 8 wherein the gas source includes a source of nitrogen.

10. The system of claim 1 wherein the gas bearing is coupled to a source of pressurized air.

11. A photolithography system for microfeature workpieces, comprising:
    a support configured to carry a microfeature workpiece;
    a radiation system positioned proximate to the support to direct radiation along a radiation path toward the support; and
    an immersion lens system that includes:
        a lens, wherein at least one of the lens and the support is movable relative to the other;
        a liquid supply device having at lease one liquid supply port positioned to deliver a liquid proximate to the lens, the liquid supply device further including a liquid return port positioned proximate to the at least one liquid supply port to remove liquid;
        a gas bearing having at least one nozzle directed toward the support;
        a gas injection device having at least one inwardly directed injection port; and
        a controller having instructions to activate selected injection ports depending upon the relative motion between the lens and the support.

12. The system of claim 11 wherein the nozzle of the gas bearing is directed generally normal to the support.

13. The system of claim 11 wherein the gas injection device includes an inwardly directed injection port positioned inwardly from the nozzle of the gas bearing.

14. The system of claim 11, further comprising a recovery port positioned proximate to the injection port, the recovery port being coupleable to a vacuum source.

15. The system of claim 14, further comprising a removable lens cover, and wherein the recovery port includes one of a plurality of recovery ports that are coupleable to the vacuum source, and wherein the recovery ports are positioned to releasably secure the cover to the immersion lens system when the immersion lens system is not in use.

16. The system of claim 11 wherein the at least one injection port includes a plurality of injection ports arranged annularly around the at least one liquid supply port.

17. The system of claim 11 wherein the at least one injection port includes a slot.

18. The system of claim 11 further comprising a gas source coupled to the at least one injection port.

19. The system of claim 18 wherein the gas source includes a source of nitrogen.

20. The system of claim 11 wherein the gas bearing is coupled to a source of pressurized air.

21. The system of claim 11, further comprising a controller operatively coupled to the gas injection device to control activation of the gas injection device.

22. A photolithography system for microfeature workpieces, comprising:
    support means for carrying a microfeature workpiece;
    a radiation system positioned proximate to the support means to direct radiation along a radiation path toward the support means; and
    an immersion lens system that includes:
        a lens;
        liquid supply means for delivering a liquid to a liquid volume in contact with the lens, and removing liquid from the liquid volume;
        a gas bearing having at least one nozzle directed toward the support;
        gas injection means for directing residual liquid on the microfeature workpiece inwardly into the liquid volume, the gas injection means being located between the at least one nozzle of gas bearing and at least a portion of the liquid supply means; and
        a controller having instructions to selectively activate the injection means dependant upon the relative motion between the lens and the support.

23. The system of claim 22 wherein the liquid supply means includes at least one liquid supply port and at least one liquid return port, and wherein the gas injection means includes an injection port positioned between the at least one liquid supply port and the at least one nozzle of the gas bearing.

24. The system of claim 22 wherein the gas injection means includes an inwardly directed injection port positioned inwardly from the nozzle of the gas bearing.

25. The system of claim 22, wherein the gas injection means includes an injection port and a recovery port positioned proximate to the injection port, the recovery port being coupleable to a vacuum source.

26. The system of claim 25 wherein the recovery port includes one of a plurality of recovery ports that are coupleable to a vacuum source, and wherein the recovery ports are positioned to at least limit movement of a cover when the system is not in use.

27. A method for irradiating a microfeature workpiece, comprising:
    directing radiation along a radiation path, through a lens and through a liquid volume in contact with the lens to a microfeature workpiece in contact with the liquid volume;
    while moving at least one of the microfeature workpiece and the lens relative to the other, recovering liquid from the liquid volume and replenishing liquid in the liquid volume;
    controlling a spacing between the lens and the microfeature workpiece by providing a gas bearing between the lens and the microfeature workpiece;
    directing residual liquid remaining on a surface of the microfeature workpiece back into the liquid volume, where directing the residual liquid includes directing multiple streams of gas toward the microfeature workpiece from corresponding multiple injection ports; and
    selectively directing the gas through different injection ports depending upon the relative motion between the microfeature workpiece and the lens.

28. The method of claim 27 wherein directing residual liquid includes directing residual liquid annularly inwardly toward the liquid volume by injecting a gas through at least one injection port that is oriented annularly inwardly toward the liquid volume.

29. The method of claim 27 wherein directing residual liquid includes propelling the residual liquid ahead of a gas stream issuing from at least one injection port.

30. The method of claim 27 wherein directing residual liquid includes injecting a gas through at least one injection port that is oriented annularly inwardly toward the liquid volume, and wherein the method further comprises directing gas to the gas bearing along a flow path that is separately controllable from a flow path of gas that is directed to the injection port.

31. The method of claim 27 wherein directing residual liquid includes propelling the residual liquid ahead of a gas stream issuing from at least one injection port and wherein controlling a spacing between the lens and the microfeature workpiece includes directing gas from a separate port to form the gas bearing between the lens and the microfeature workpiece.

32. The method of claim 31 wherein the gas stream includes nitrogen.

33. The method of claim 27 wherein directing residual liquid includes propelling the residual liquid ahead of a gas stream issuing from a plurality of injection ports.

34. The method of claim 27 wherein directing residual liquid remaining on a surface of the microfeature workpiece includes directing a first quantity of residual liquid remaining on a portion of the surface of the workpiece into the liquid volume, and wherein the method further comprises:
    removing a second quantity of residual liquid remaining on the surface of the microfeature workpiece by applying a vacuum proximate to the surface of the microfeature workpiece; and wherein
    recovering liquid from the liquid volume includes recovering liquid that was directed into the liquid volume.

35. The method of claim 27 wherein directing residual liquid remaining on a surface of the microfeature workpiece includes directing a first quantity of residual liquid remaining on a portion of the surface of the workpiece into the liquid volume, and wherein the method further comprises:
    removing a second quantity of residual liquid remaining on the surface of the microfeature workpiece by applying a vacuum proximate to the surface of the microfeature workpiece; and wherein
    recovering liquid from the liquid volume includes recovering liquid that was directed into the liquid volume; and wherein the method further comprises:
    drawing a lens cover in place with the vacuum when the lens is not in use.

36. The method of claim 27 wherein directing residual liquid includes drying the surface of the microfeature workpiece.

37. The method of claim 27 wherein directing residual liquid includes selectively activating at least one of the multiple injection ports and selectively deactivating at least another one of the multiple injection ports.

38. A method for irradiating a microfeature workpiece, comprising:
positioning a lens relative to a microfeature workpiece by directing air between the lens and the microfeature workpiece to form an air bearing;
directing radiation along a radiation path, through the lens and to the microfeature workpiece through a liquid volume in contact with both the lens and the microfeature workpiece;
while moving the microfeature workpiece relative to the lens, recovering liquid from the liquid volume, and replenishing liquid in the liquid volume;
as the microfeature workpiece and the liquid volume move relative to the lens, leaving residual liquid on the microfeature workpiece;
directing a first portion of the residual liquid remaining on a surface of the microfeature workpiece back into the liquid volume by directing a plurality of nitrogen jets toward the liquid volume through different ports depending upon the relative motion between the microfeature workpiece and the lens; and
removing a second portion of the residual liquid from the workpiece by drawing a vacuum on the second portion through a plurality of vacuum ports.

39. The method of claim 38, further comprising releasably securing a cover over the lens after use by drawing a vacuum on the cover through the vacuum ports.

40. The method of claim 38 wherein directing a plurality of nitrogen jets includes directing a plurality of nitrogen jets simultaneously from multiple, opposing directions.

41. A photolithography system for microfeature workpieces, comprising:
a support configured to carry a microfeature workpiece;
a radiation system positioned proximate to the support to direct radiation along a radiation path toward the support; and
an immersion lens system that includes:
  a lens, wherein at least one of the lens and the support is movable relative to the other;
  a liquid supply device having at least one liquid supply port positioned to deliver a liquid proximate to the lens, the liquid supply device further including a liquid return port positioned proximate to the at least one liquid supply port to remove liquid;
  a gas bearing having at least one nozzle directed toward the support; and
  a gas injection device having at least one inwardly directed injection port wherein the at least one gas bearing nozzle forms a portion of a first gas flow path and the at least one injection port forms a portion of a second gas flow path, with a flow of gas along the first flow path being separately controllable from a flow of gas along the second flow path.

42. The system of claim 41 wherein the gas injection device includes an inwardly directed injection port positioned inwardly from the nozzle of the gas bearing.

43. The system of claim 41, further comprising a recovery port positioned proximate to the injection port, the recovery port being coupleable to a vacuum source.

44. The system of claim 41, further comprising a removable lens cover, and wherein the recovery port includes one of a plurality of recovery ports that are coupleable to a vacuum source, and wherein the recovery ports are positioned to releasably secure the cover to the immersion lens system when the immersion lens system is not in use.

45. The system of claim 41 wherein the at least one injection port includes a plurality of injection ports arranged annularly around the at least one liquid supply port.

46. The system of claim 41 wherein the at least one injection port includes a slot.

47. The system of claim 41 further comprising a gas source coupled to the at least one injection port.

48. The system of claim 47 wherein the gas source includes a source of nitrogen.

49. The system of claim 48 wherein the gas bearing is coupled to a source of pressurized air.

50. The system of claim 41, further comprising a controller operatively coupled to the gas injection device to control activation of the gas injection device.

51. The system of claim 50 wherein the gas injection device includes multiple injection ports, and wherein the controller is configured to activate selected injection ports depending upon relative motion between the lens and the support.

52. A method for irradiating a microfeature workpiece, comprising:
directing radiation along a radiation path, through a lens and through a liquid volume in contact with the lens to a microfeature workpiece in contact with the liquid volume;
while moving at least one of the microfeature workpiece and the lens relative to the other, recovering liquid from the liquid volume and replenishing liquid in the liquid volume;
controlling a spacing between the lens and the microfeature workpiece by providing a gas bearing between the lens and the microfeature workpiece;
directing residual liquid remaining on a surface of the microfeature workpiece back into the liquid volume, wherein directing the residual liquid includes injecting a gas through at least one injection port that is oriented annularly inwardly toward the liquid volume; and
separately controlling a first flow of gas to the gas bearing and a second flow of gas to the at least one injection port.

53. The method of claim 52 wherein directing residual liquid includes directing residual liquid annularly inwardly toward the liquid volume by injecting a gas through at least one injection port that is oriented annularly inwardly toward the liquid volume.

54. The method of claim 52 wherein directing residual liquid includes propelling the residual liquid ahead of a gas stream issuing from at least one injection port.

55. The method of claim 52 wherein directing residual liquid includes propelling the residual liquid ahead of a gas stream issuing from the at least one injection port and wherein controlling a spacing between the lens and the microfeature workpiece includes directing gas from a separate port to form the gas bearing between the lens and the microfeature workpiece.

56. The method of claim 55 wherein the gas stream includes nitrogen.

57. The method of claim 52 wherein directing residual liquid includes propelling the residual liquid ahead of a gas stream issuing from a plurality of injection ports.

58. The method of claim 52 wherein directing residual liquid remaining on a surface of the microfeature workpiece includes directing a first quantity of residual liquid remaining on a portion of the surface of the workpiece into the liquid volume, and wherein the method further comprises:

removing a second quantity of residual liquid remaining on the surface of the microfeature workpiece by applying a vacuum proximate to the surface of the microfeature workpiece; and wherein recovering liquid from the liquid volume includes recovering liquid that was directed into the liquid volume.

59. The method of claim 52 wherein directing residual liquid remaining on a surface of the microfeature workpiece includes directing a first quantity of residual liquid remaining on a portion of the surface of the workpiece into the liquid volume, and wherein the method further comprises:

removing a second quantity of residual liquid remaining on the surface of the microfeature workpiece by applying a vacuum proximate to the surface of the microfeature workpiece; and wherein recovering liquid from the liquid volume includes recovering liquid that was directed into the liquid volume; and wherein the method further comprises:

drawing a lens cover in place with the vacuum when the lens is not in use.

60. The method of claim 52 wherein directing residual liquid includes drying the surface of the microfeature workpiece.

61. The method of claim 52 wherein directing residual liquid includes directing multiple streams of gas toward the microfeature workpiece from corresponding multiple ports, and wherein the method further comprises selectively directing the gas through different ports depending upon the direction of the relative motion between the microfeature workpiece and the lens.

62. A photolithography system for microfeature workpieces, comprising:

a support configured to carry a microfeature workpiece;

a radiation system positioned proximate to the support to direct radiation along a radiation path toward the support; and an immersion lens system that includes:
   a lens, wherein at least one of the lens and the support is movable relative to the other;
   a removable lens cover;
   a liquid supply device having at least one liquid supply port positioned to deliver a liquid proximate to the lens, the liquid supply device further including a liquid return port positioned proximate to the at least one liquid supply port to remove liquid;
   a gas bearing having at least one nozzle directed toward the support;
   a gas injection device having at least one inwardly directed injection port; and
   a plurality of recovery ports that are coupleable to a vacuum source, the recovery ports being positioned to releasably secure the cover to the immersion lens system when the immersion lens system is not in use.

63. A method for irradiating a microfeature workpiece, comprising:

directing radiation along a radiation path, through a lens and through a liquid volume in contact with the lens to a microfeature workpiece in contact with the liquid volume;

while moving at least one of the microfeature workpiece and the lens relative to the other, recovering liquid from the liquid volume and replenishing liquid in the liquid volume;

controlling a spacing between the lens and the microfeature workpiece by providing a gas bearing between the lens and the microfeature workpiece;

directing a first quantity of residual liquid remaining on a surface of the microfeature workpiece back into the liquid volume, wherein recovering liquid from the liquid volume includes recovering liquid that was directed into the liquid volume; and removing a second quantity of residual liquid remaining on the surface of the microfeature workpiece by applying a vacuum proximate to the surface of the microfeature workpiece; and drawing a lens cover with the vacuum when the lens is not in use.

64. A photolithography system for microfeature workpieces, comprising:

support means for carrying a microfeature workpiece;

a radiation system positioned proximate to the support means to direct radiation along a radiation path toward the support means; and an immersion lens system that includes:
   a lens;
   liquid supply means for delivering a liquid to a liquid volume in contact with the lens, and removing liquid from the liquid volume;
   a gas bearing having at least one nozzle directed toward the support;
   gas injection means including a plurality of injection ports for directing residual liquid on the microfeature workpiece inwardly into the liquid volume, the injection ports being located between the at least one nozzle of the gas bearing and at least a portion of the liquid supply means; and
   a plurality of recovery ports positioned proximate to the injection ports that are coupleable to a vacuum source, and wherein the recovery ports are positioned to at least limit movement of a cover when the system is not in use.

* * * * *

UNITED STATES PATENT AND TRADEMARK OFFICE
CERTIFICATE OF CORRECTION

PATENT NO. : 7,583,358 B2 Page 1 of 1
APPLICATION NO. : 11/189236
DATED : September 1, 2009
INVENTOR(S) : Peter A. Benson It is certified that error appears in the above-identified patent and that said Letters Patent is hereby corrected as shown below:

In column 8, line 44, in Claim 11, delete "lease" and insert -- least --, therefor.

Signed and Sealed this

Thirteenth Day of October, 2009

David J. Kappos
*Director of the United States Patent and Trademark Office*